US010969505B2

(12) United States Patent
Jenkins et al.

(10) Patent No.: US 10,969,505 B2
(45) Date of Patent: Apr. 6, 2021

(54) CHARGED PARTICLE DETECTOR

(71) Applicant: UNIVERSITY OF YORK, York (GB)

(72) Inventors: David Jenkins, York (GB); Thomas Krauss, York (GB); Christian Schuster, York (GB)

(73) Assignee: UNIVERSITY OF YORK, York (GB)

( * ) Notice: Subject to any disclaimer, the term of this patent is extended or adjusted under 35 U.S.C. 154(b) by 0 days.

(21) Appl. No.: 16/471,110

(22) PCT Filed: Dec. 18, 2017

(86) PCT No.: PCT/GB2017/053780
§ 371 (c)(1),
(2) Date: Jun. 19, 2019

(87) PCT Pub. No.: WO2018/115825
PCT Pub. Date: Jun. 28, 2018

(65) Prior Publication Data
US 2019/0324162 A1    Oct. 24, 2019

(30) Foreign Application Priority Data
Dec. 20, 2016 (GB) ................... 1621750.7

(51) Int. Cl.
| | | |
|---|---|---|
| *G01T 3/08* | (2006.01) | |
| *H01L 27/144* | (2006.01) | |
| *H01L 31/02* | (2006.01) | |
| *H01L 31/0216* | (2014.01) | |

(Continued)

(52) U.S. Cl.
CPC ............ *G01T 3/08* (2013.01); *H01L 27/1446* (2013.01); *H01L 31/02019* (2013.01); *H01L 31/02164* (2013.01); *H01L 31/03926* (2013.01); *H01L 31/1185* (2013.01)

(58) Field of Classification Search
CPC .......... H01L 27/1446; H01L 31/02164; H01L 31/03926; H01L 31/1185; G01T 3/08
See application file for complete search history.

(56) References Cited

U.S. PATENT DOCUMENTS

| | | | | |
|---|---|---|---|---|
| 10,446,582 B2 * | 10/2019 | Smith | ............... | H01L 27/1262 |
| 2003/0031296 A1 * | 2/2003 | Hoheisel | ............... | G01T 1/2018 |
| | | | | 378/98.8 |
| 2004/0016886 A1 | 1/2004 | Ringermacher | | |

(Continued)

FOREIGN PATENT DOCUMENTS

| | | |
|---|---|---|
| WO | 2009/117477 A2 | 9/2009 |
| WO | 2013/017915 A1 | 2/2013 |
| WO | 2015/138329 A1 | 9/2015 |

OTHER PUBLICATIONS

International Preliminary Report on Patentability (IPRP) for corresponding App. No. PCT/GB2017/053780, dated Jun. 25, 2019.

(Continued)

*Primary Examiner* — David P Porta
*Assistant Examiner* — Fani Boosalis
(74) *Attorney, Agent, or Firm* — Renner, Otto, Boisselle & Sklar, LLP

(57) ABSTRACT

A charged particle detector is provided. The charged particle detector includes a flexible semiconductor wafer, the semiconductor wafer being doped to form a p-n junction, and an amplifier coupled to the semiconductor wafer and configured to amplify a current or voltage across the p-n junction.

13 Claims, 2 Drawing Sheets

(51) Int. Cl.
*H01L 31/0392* (2006.01)
*H01L 31/118* (2006.01)

(56) References Cited

U.S. PATENT DOCUMENTS

| | | |
|---|---|---|
| 2004/0178337 A1 | 9/2004 | Baker Hughes |
| 2005/0012044 A1 | 1/2005 | Tadokoro |
| 2013/0334427 A1 | 12/2013 | Fujifilm |
| 2014/0264436 A1 | 9/2014 | Whiting |

OTHER PUBLICATIONS

International Search Report and Written Opinion for corresponding Application No. PCT/GB2017/053780, dated Mar. 9, 2018.
Search Report for corresponding Application No. GB1621750.7, dated Jun. 20, 2017.

* cited by examiner

CHARGED PARTICLE DETECTOR

FIELD OF THE INVENTION

The present invention relates to the detection of charged particles such as alpha particles. In particular, the present invention relates to a flexible or curved charged particle detector.

BACKGROUND

The decommissioning of nuclear sites requires reliable techniques for the detection, identification and quantification of radioactive substances. In this scenario, the discrimination between disposable and contaminated waste is mainly driven by the cost of decommissioning. The UK government has already forecasted a cost of at least £117 billion for decommissioning UK nuclear sites over the next century. New technologies and solutions therefore need to be explored in order to reduce the associated financial figure and to speed up the decommissioning progress.

In particular, there is no low-cost solution available for assessing the presence of alpha-radioactive sources, such as plutonium, inside pipework. The emission of alpha-particles is an intrinsically short range process (a few cm in air, a few mm or microns in solid material) and as such undetectable from the outside of the pipe, as any radiation occurring on the inside of the pipe is absorbed by the pipe wall. Consequently, alpha-particle detectors must be positioned inside a pipe and as close as possible to the inner walls to ensure effective detection.

Pipeline inspection gauges (PIGs) are routinely used in surveys of the internal condition of pipes. Potential alpha contamination could thus be located by arranging multiple detectors around a PIG. However, the efficiency of alpha-detection is then dependent upon the number of detectors. Each detector is flat, so the larger each individual detector, the greater the average distance to the pipe wall. A ring of many individual detectors which closely approximates a circle would be expensive and cumbersome.

Conventional monitoring instruments are instead based on a multi-step, indirect and hence less-efficient detection mechanism. For example, if alpha-particles excite a fluorescent material, like molecular nitrogen in air, it will relax to its ground state by the emission of light. Scintillation detectors are able to relate the induced luminescence to the presence of radioactivity. However, they are not very sensitive to the type of primary particle, because the luminescence caused by charged particles is mostly proportional to the energy loss in the media.

A more recent and efficient detection method bases upon the measurement of air-driving ions: if ambient air is struck by alpha particles, the ionized air molecules can be driven to an ionization chamber via a fan. Modelling the airspeed distribution inside the pipe makes it possible to determine the drifted distance from the source to the chamber, and so to locate the alpha-radiation. However, as this method requires a testing chamber for inspection, each pipe must be cut into segments—which may not be possible for the inspection of a long pipework.

Similar issues are faced in high-energy particle experiments. There is a need to detect energetic charged particles, which is currently done with a plurality of detectors arrayed around and within the beam pipe, each defining a pixel. However, damage to individual pixels often requires expensive replacements, and the choice of number of detectors is a trade-off between accuracy (more detectors allows a closer approximation to cylindrical geometry) and cost.

SUMMARY

According to one aspect of the present invention there is provided a charged particle detector. The charged particle detector comprises a flexible semiconductor wafer, the semiconductor wafer being doped to form a p-n junction, and an amplifier coupled to the semiconductor wafer and configured to amplify a current or voltage across the p-n junction.

According to another aspect of the present invention there is provided a neutron detector. The neutron detector comprises a charged particle detector according to the first aspect, and a material which produces charged particles when exposed to neutron flux.

According to a further aspect of the present invention there is provided a pipe having a charged particle detector according the first aspect lining the inside of the pipe.

According to a further aspect of the present invention there is provided a pipe having a neutron detector according to the second aspect lining the outside of the pipe.

Further aspects and preferred features are set out in claim 2 et seq.

DETAILED DESCRIPTION

Figure 1:
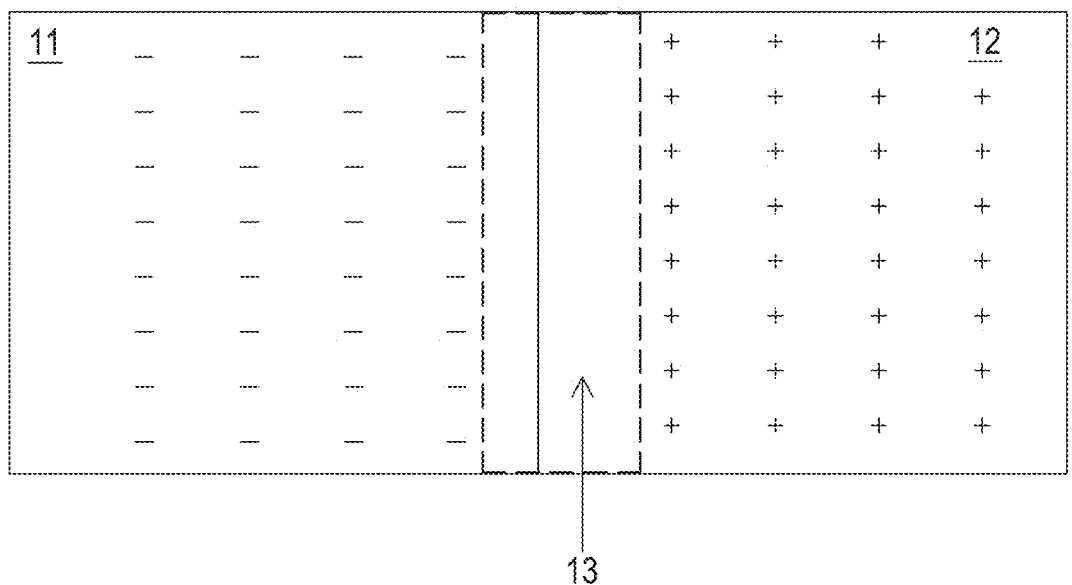
FIG. 1 is a schematic illustration of a p-n junction.

Direct detection of alpha particles may be achieved by the use of a p-n junction, as illustrated in FIG. 1. A p-n junction is formed from a semiconductor (e.g. silicon), doped such that one side of the junction 11 has an excess of electrons (n-type), and the other has an excess of holes 12 (p-type). At the junction itself, a depletion layer 13 is formed where electrons from the n side diffuse into the p side, and holes from the p side diffuse into the n side. The electrons from the n side recombine with holes on the p side, and vice versa, resulting in a lack of charge carriers in the depletion zone. This causes the p-n junction to act as a diode. When a positive voltage is applied to the n-type side and a negative voltage applied to the p-type side, then no current can flow as the depletion layer has no free charge carriers ("reverse bias"). In contrast, when a positive voltage is applied to the p-type side and a negative voltage applied to the n-type side, the holes in the p-type region and electrons in the n-type region are pushed into the depletion region, neutralising it at high enough voltage and allowing current to flow ("forward bias").

When an alpha particle interacts with a p-n junction, it ionises the semiconductor along its path. This results in the creation of electrons and holes along the path, which allows current to flow even if the p-n junction is not under sufficient forward bias. This creates a measurable voltage spike, which depends on the energy of the alpha particle and its angle of incidence. Gamma radiation will generally not interact strongly enough with a p-n junction to be detectable. Charged particles other than alpha particles may be detected, depending on the properties of the detector (discussed in more detail below).

A flexible p-n junction can be made from sufficiently thin semiconductor wafers, e.g. silicon wafers of less than 70 micron thickness. It is proposed herein to use such a p-n junction to make a flexible charged particle detector. This detector can be made into a shape more suitable for detecting charged particles inside confined tubing (e.g. used as an inlay on the inside of the tubing, or wrapped around a pipe inspection gauge).

In order to detect the charged particles effectively, the thickness of the wafer should be close to or greater than the Bragg peak depth of the particles to be detected in the semiconductor used. The Bragg peak is the peak of the curve which plots the energy loss of the particle during its travel through the material (in this case, the semiconductor). For 5 MeV alpha particles in silicon, the Bragg peak is at 22 microns, so a wafer thickness of greater than 20 microns is suitable. Detection of other particles in other materials where the Bragg peak depth is lower may allow lower minimum wafer thicknesses, although reduced thickness results in increased fragility.

An exemplary fabrication process for a flexible alpha particle detector is described below. While certain materials and dimensions are given in this example, the skilled person will appreciate that other suitable materials and dimensions can be substituted, and that fabrication steps may be substituted with equivalent steps which produce the same result.

A 50 micron thick silicon wafer is formed using the Czochralski method. The float zone method may also be used—but the Czhochralski method is preferred as it is lower cost, and forms wafers with a high oxygen content (which increases the strength of material and reduces the effect of radiation damage). A 500 nm thick sacrificial oxide layer is grown to remove any damaged surface regions and/or contamination.

Phosphorus doping is introduced by thermal diffusion using a solid planar diffusion source, e.g. the diffusion source available from Saint-Gobain (PH-1025). The source wafer is placed immediately adjacent and parallel to the silicon p-type wafers, and doping is carried out at 1025° C. in a $N_2$ atmosphere for 60 minutes. Other dopant sources (e.g. boron) may be used, but may require further processing steps (e.g. for removal of a borosilicate glass layer). The oxide layer on the front side of the wafer is removed and faces towards the source wafer, and the remaining oxide on the back side of the wafer acts as a masking layer during the doping step. RCA cleans are performed prior to each high-temperature processing step.

Figure 2:
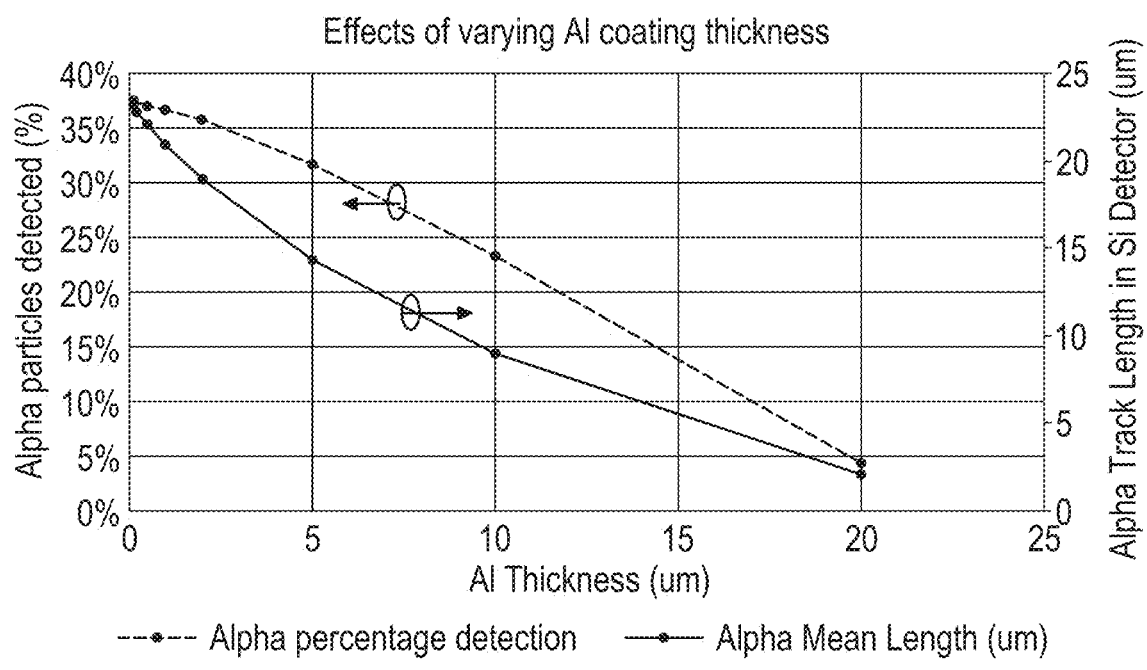
FIG. 2 is a graph showing alpha particle detection rates and track length against Aluminium coating thickness.

Any excess glass which forms during the doping process is removed from the wafer. A thin aluminium layer is deposited on both sides of the wafer. The aluminium blocks optical photons from the wafer (reducing noise), but must be thin enough to allow alpha particles to pass through. FIG. 2 shows a graph of detection rate and track length in the wafer vs the thickness of the aluminium layer. Depending on the detector sensitivity required, the thickness of the aluminium may be 2 microns or less, preferably less than 1 micron, or even less than 200 nm. The aluminium also acts as an electrical contact for the wafer. Other coating materials and/or thicknesses may be used for detectors configured to detect other charged particles.

Once a suitable p-n junction has been formed by the above method or any other suitable process, it may be used as part of a detector.

As noted above, the energy of the charged particles is expended up to the Bragg peak depth—i.e. the vast majority of electron-hole pairs will be created in the semiconductor up to this depth. As long as the created minority carriers (i.e. electrons in the p-type region and holes in the n-type region) are able to reach the p-n junction via diffusion, the depletion region itself does not need to extend so deeply into the material. For example, using the wafer fabrication steps outlined above, a p-n junction depth of 2.5 microns was obtained, with a depletion layer thickness of 1 micron, which acted suitably to detect alpha particles of 5 MeV (Bragg peak depth of 22 microns).

Figure 3:
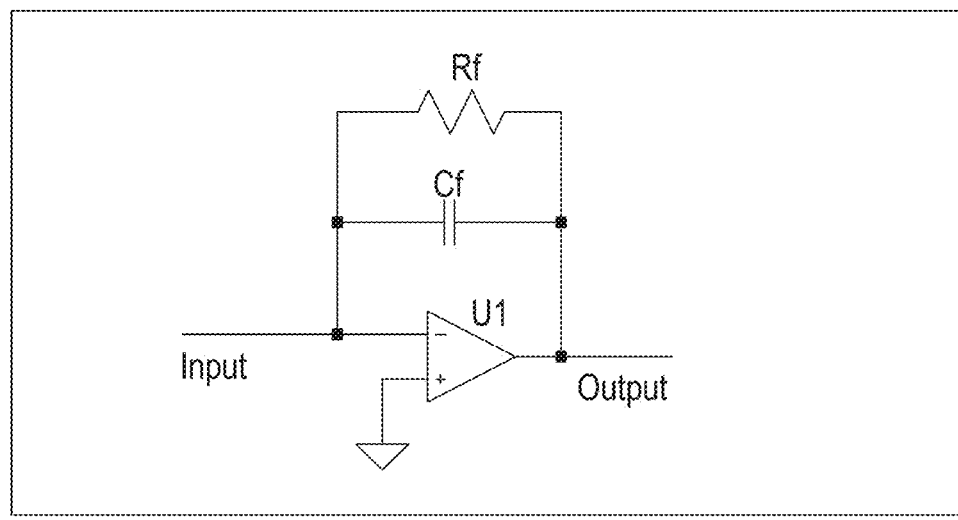
FIG. 3 is a circuit diagram of an exemplary amplifier.

A charge sensitive amplifier will be required to detect the signals generated by charged particles. An exemplary amplifier is shown in FIG. 3.

The signal-to-noise ratio (SNR) of the detector depends on several factors. The SNR will be improved for p-n junctions with favourable diode characteristics—i.e. small currents in reverse bias and a sharp turn on at the threshold voltage in forward bias. The SNR is generally improved with decreasing capacitance of the p-n junction. A large detector size is desirable to capture low levels of charged particles, which will tend to increase the capacitance, but the capacitance can be reduced by using a more resistive substrate, a lower doped substrate, operating the diode with (greater) reverse bias, or some combination of the above. As an example, a lower doped, more resistive substrate may have a resistance of greater than 1000 Ohm centimetres The amplifier stage should be tuned to the capacitance of the p-n junction to improve SNR.

In order to provide position-resolved information, the electrical contacts on one or both sides of the p-n junction may be subdivided into pixels. A signal for a charged particle incident on the p-n junction will then primarily be picked up by the closest pixel.

The detector may be adapted for the detection of neutrons by introducing a material which produces charged particles (e.g. alpha particles) when exposed to neutrons. For example a thin layer of boron oxide may be used as the intrinsic region between two flexible silicon sheets of different doping types. Since the interaction of $^{10}B$ with thermal neutrons produces alpha particles, such a detector would be able to detect thermal neutrons with very high efficiency (up to 100%).

The flexible p-n junctions may be mounted to provide a detector with a curved surface. This may comprise mounting the p-n junction with a fixed curvature, or mounting it such that the curvature can be adjusted as required. The p-n junction may be mounted on a pipe inspection gauge (e.g. for use when looking for alpha sources in pipework during nuclear reactor decommissioning), and may be mounted such that the curvature of the p-n junction is concentric with the pipe to be inspected. Alternatively, the p-n junction may be fixed to a pipe—e.g. lining the inside of a pipe to detect high energy particles, or a p-n junction adapted to detect neutrons lining the outside of a pipe to detect neutrons (e.g. in a nuclear fission reactor).

Figure 4:
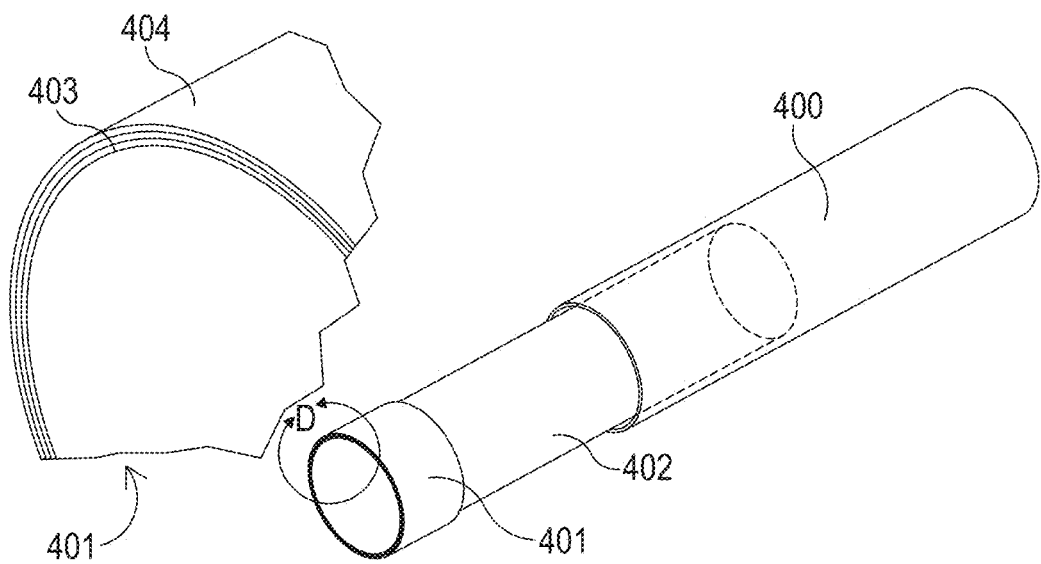
FIG. 4 is a schematic illustration of a pipe gauge mounted detector.

An exemplary detector for use in inspecting a pipe is shown in FIG. 4. The detector 401 is mounted on a pipe gauge 402, which can be inserted into a pipe 400. The diameter of the detector 401 when mounted on the gauge 402 is slightly less than the internal diameter of the pipe 400. The detector is formed of a p-type wafer 403 and an n-type wafer 404, which are bonded together to form a p-n junction, and which are flexible.

The p-n junctions may be mounted in such a way that the radius of curvature can be adjusted. This means that the same detector could be used for multiple different applications, e.g. a range of pipe diameters, or for larger barrels.

In order to provide complete coverage without requiring excessively large wafers, multiple p-n junctions may be mounted on a single gauge or on the pipe. For example, a 5 cm diameter pipe may be inspected using a detector comprising three p-n junctions, each with 5 cm width and covering 120° of arc (with some gap between the detector and pipe walls). This will still provide improved results over current detectors which use multiple flat p-n junctions, as the distance between the p-n junction and the pipe wall will be substantially constant. The radius of curvature of the flexible p-n junction should be substantially similar to that of the pipe to be measured (in practice, slightly smaller so that it can fit inside the pipe). When creating a flexible p-n junction for use as a detector for a specific pipe, the flexibility of the junction should be sufficient to achieve the required radius of curvature. For example, for a 5 cm (2 inch) diameter pipe (as typically employed in many nuclear installations), the minimum radius of curvature for the flexible p-n junction should be at most 2.5 cm. The minimum radius of curvature for such a junction is ultimately determined by the flexibility of the wafer, which is in turn determined by the thickness. In order to achieve a flexibility sufficient to achieve a 2.5 cm radius of curvature, the maximum thickness of the wafer is likely to be of the order of 70 microns or less.

The invention claimed is:

1. A charged particle detector comprising:
   a flexible semiconductor wafer, the semiconductor wafer being doped to form a p-n junction;
   an amplifier coupled to the semiconductor wafer and configured to amplify a current or voltage across the p-n junction;
   a layer of aluminium on each surface of the flexible semiconductor wafer, each layer of aluminium being of a thickness sufficient to exclude optical photons, and which is transparent to alpha particles;
   wherein the amplifier is coupled to the semiconductor wafer via the aluminium layers.

2. The charged particle detector according to claim 1, wherein the flexible semiconductor wafer is mounted so as to provide a curved alpha particle detection surface.

3. The charged particle detector according to claim 2, wherein the flexible semiconductor wafer is mounted to a pipe inspection gauge.

4. The charged particle detector according to claim 2, wherein the flexible semiconductor wafer is mounted on an inner surface of a pipe.

5. The charged particle detector according to claim 1, wherein the semiconductor wafer is a silicon wafer with a thickness of between 20 and 70 microns.

6. The charged particle detector according to claim 1, wherein each aluminium layer is 200 nm thick.

7. The charged particle detector according to claim 1, wherein at least one of the aluminium layers is subdivided into a plurality of pixels, each pixel being coupled to a different amplifier.

8. The charged particle detector according to claim 1, wherein the flexible semiconductor wafer has a minimum radius of curvature less than 10 cm.

9. A neutron detector comprising a charged particle detector according to claim 1, and a material which produces charged particles when exposed to neutron flux.

10. The neutron detector according to claim 9, wherein the charged particles are alpha particles and the substance comprises boron-10.

11. The neutron detector according to claim 10, wherein the material is boron oxide, the flexible semiconductor wafer comprises two flexible semiconductor sheets of different doping types, and the boron oxide is provided as an intrinsic region between the two flexible silicon sheets.

12. A pipe having a neutron detector according to claim 9 lining the outside of the pipe.

13. A pipe having a charged particle detector according to claim 1 lining the inside of the pipe.

* * * * *